(12) United States Patent
Grunzke

(10) Patent No.: US 9,251,068 B2
(45) Date of Patent: Feb. 2, 2016

(54) SYSTEMS, DEVICES, MEMORY CONTROLLERS, AND METHODS FOR MEMORY INITIALIZATION

(71) Applicant: Micron Technology, Inc., Boise, ID (US)

(72) Inventor: Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/483,927

(22) Filed: Sep. 11, 2014

(65) Prior Publication Data

US 2015/0052317 A1  Feb. 19, 2015

Related U.S. Application Data

(63) Continuation of application No. 13/046,446, filed on Mar. 11, 2011, now Pat. No. 8,856,482.

(51) Int. Cl.
| | |
|---|---|
| *G06F 12/00* | (2006.01) |
| *G06F 13/00* | (2006.01) |
| *G06F 12/06* | (2006.01) |
| *G06F 3/06* | (2006.01) |
| *G06F 12/08* | (2006.01) |
| *G11C 7/20* | (2006.01) |

(52) U.S. Cl.
CPC ............ *G06F 12/0653* (2013.01); *G06F 3/061* (2013.01); *G06F 3/0626* (2013.01); *G06F 3/0631* (2013.01); *G06F 3/0632* (2013.01); *G06F 3/0688* (2013.01); *G06F 12/0661* (2013.01); *G06F 12/0813* (2013.01); *G11C 7/20* (2013.01); *G06F 3/0658* (2013.01)

(58) Field of Classification Search
None
See application file for complete search history.

(56) References Cited

U.S. PATENT DOCUMENTS

| | | | |
|---|---|---|---|
| 5,056,015 A | 10/1991 | Baldwin et al. | |
| 6,253,293 B1 * | 6/2001 | Rao .......................... | G10L 19/16 700/94 |
| 6,636,957 B2 | 10/2003 | Stevens et al. | |
| 6,834,322 B2 | 12/2004 | Sukegawa | |
| 7,269,082 B2 | 9/2007 | Naito | |
| 7,650,459 B2 | 1/2010 | Eilert et al. | |
| 7,652,922 B2 | 1/2010 | Kim et al. | |
| 7,755,947 B2 | 7/2010 | Fujita et al. | |
| 7,778,057 B2 | 8/2010 | McCarthy et al. | |
| 7,831,742 B2 | 11/2010 | Bernardi | |

(Continued)

FOREIGN PATENT DOCUMENTS

| | | |
|---|---|---|
| CN | 1342282 | 3/2002 |
| JP | 2000-315185 | 11/2000 |

(Continued)

OTHER PUBLICATIONS

Hynix Semiconductor, et al. Open NAND flash interface specification, Tech. Rep. Revision 3.0, ONFI, Mar. 3, 2011.*

(Continued)

*Primary Examiner* — Sean D Rossiter
(74) *Attorney, Agent, or Firm* — Brooks, Cameron & Huebsch, PLLC

(57) ABSTRACT

Systems, devices, memory controllers, and methods for initializing memory are described. Initializing memory can include configuring memory devices in parallel. The memory devices can receive a shared enable signal. A unique volume address can be assigned to each of the memory devices.

20 Claims, 5 Drawing Sheets

(56) References Cited

U.S. PATENT DOCUMENTS

| | | | |
|---|---|---|---|
| 7,864,622 B2 | 1/2011 | Sohn et al. | |
| 8,458,404 B1* | 6/2013 | Delgross | G06F 12/0864 |
| | | | 711/128 |
| 8,868,843 B2* | 10/2014 | Loh | G06F 12/0888 |
| | | | 711/138 |
| 2001/0003837 A1 | 6/2001 | Normal et al. | |
| 2002/0188781 A1 | 12/2002 | Schoch et al. | |
| 2004/0037133 A1 | 2/2004 | Park et al. | |
| 2005/0154819 A1 | 7/2005 | Conley et al. | |
| 2007/0070743 A1* | 3/2007 | Do | G11C 29/26 |
| | | | 365/201 |
| 2007/0076502 A1 | 4/2007 | Pyeon et al. | |
| 2007/0233917 A1 | 10/2007 | Pyeon et al. | |
| 2008/0212391 A1 | 9/2008 | Sohn et al. | |
| 2008/0253191 A1 | 10/2008 | Kang | |
| 2008/0320214 A1 | 12/2008 | Ma et al. | |
| 2009/0043932 A1 | 2/2009 | Bernardi | |
| 2009/0161451 A1 | 6/2009 | Kim | |
| 2009/0198857 A1 | 8/2009 | Pyeon | |
| 2010/0082884 A1 | 4/2010 | Chen et al. | |
| 2010/0174851 A1 | 7/2010 | Leibowitz et al. | |
| 2010/0246280 A1 | 9/2010 | Kanda | |
| 2010/0259980 A1 | 10/2010 | Futatsuyama | |
| 2011/0283057 A1* | 11/2011 | Snyder | G06F 1/08 |
| | | | 711/103 |
| 2011/0299317 A1 | 12/2011 | Shaeffer et al. | |
| 2012/0230110 A1* | 9/2012 | Nobunaga | G11C 5/04 |
| | | | 365/185.18 |
| 2012/0233433 A1* | 9/2012 | Grunzke | G11C 7/20 |
| | | | 711/170 |

FOREIGN PATENT DOCUMENTS

| | | |
|---|---|---|
| JP | 2006-172700 | 6/2006 |
| JP | 2011507141 | 3/2011 |
| WO | 2010132995 | 11/2010 |

OTHER PUBLICATIONS

Hynix Semiconductor, et al. Open NAND flash interface specification, Tech. Rep. Revision 2.0, ONFI, Feb. 27, 2008.*

Grunzke, ONFI 3.0 The Path to 400MT/s NAND Interface Speeds, Flash Memory Summit, Santa Clara, California, http://www.flashmemorysummit.com/English/Collaterals/Proceesings/2010/20100818_S104_Grunzke.pdf, accessed from web-site Jan. 20, 2010 (17 pgs.).

Terry Grunzke, Line Termination Methods and Apparatus, filed Aug. 13, 2010 as U.S. Appl. No. 12/856,000 (32 pgs.).

Abraham, et al., Data Signal Mirroring, filed Mar. 11, 2011 as U.S. Appl. No. 13/046,420 (22 pgs.).

Feeley, et al., Copyback Operations, filed Mar. 11, 2011 as U.S. Appl. No. 13/046,427 (23 pgs.).

Butterfield, Systems, Devices, Memory Controllers, and Methods for Controlling Memory, filed Mar. 11, 2011 as U.S. Appl. No. 13/046,439 (27 pgs.).

ONFI Workgroup, Open NAND Flash Interface Specification Revision 3.0, ONFI Workgroup, Published Mar. 15, 2011 (288 pgs.).

Nobunaga, Method and Apparatus for Addressing Memory Arrays, filed Mar. 11, 2011 as U.S. Appl. No. 13/046,248 (29 pgs.).

International Search Report and Written Opinion for related PCT Application No. PCT/US2012/028291, mailed Oct. 23, 2012, (15 pgs.).

Notice of Rejection for related Japanese Patent Application No. 2013-557865, dated Jul. 11, 2014, 6 pages.

Office Action for related Taiwanese Patent Application No. 101108159, dated Jul. 22, 2014, 20 pages.

Notice of Refusal for related Japan Patent Application No. 2013-557865, dated Nov. 11, 2014, 3 pages.

Notice of Rejection for related Korea Patent Application No. 10-2013-7026781, dated Jan. 5, 2015, 8 pages.

Supplementary EP Search Report and Written Opinion for related EP Patent Application No. 12757369.9, dated Dec. 19, 2014, 7 pages.

Hynix Semiconductor: "Open NAND Flash Interface Specification Revision 3.0 Mar. 9, 2011", retrieved from http://ir.elpida.com/-/media/Documents/Products/Other Documents/ONFI3_0Gold.pdf, dated Mar. 9, 2011, 288 pages. Uploaded in Two Parts.

Office Action for related Taiwan Patent Application No. 103146132, dated Aug. 21, 2015, 14 pages.

Office Action for related China Patent Application No. 201280018889.5, dated Jul. 16, 2015, 17 pages.

* cited by examiner

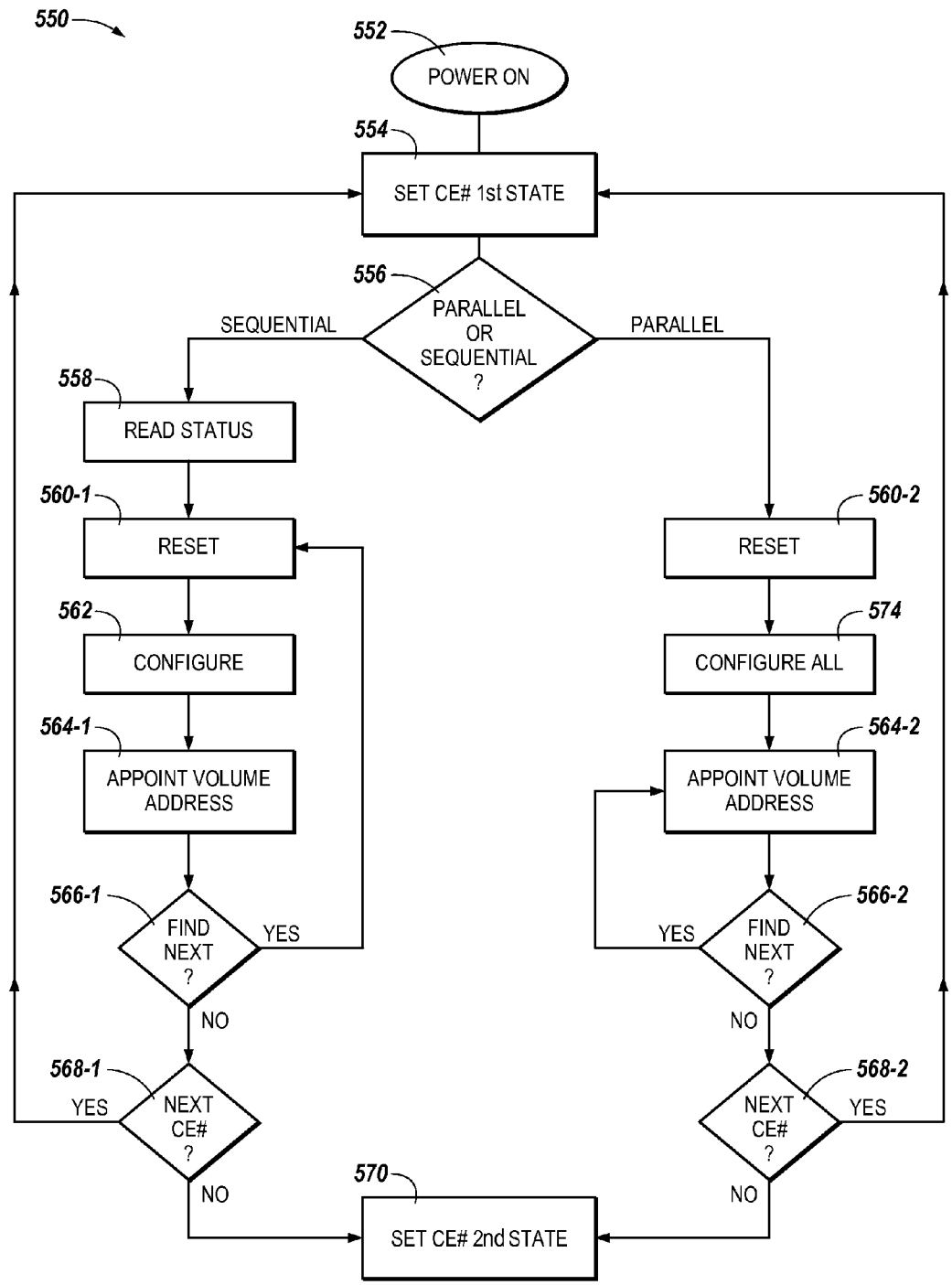

SYSTEMS, DEVICES, MEMORY CONTROLLERS, AND METHODS FOR MEMORY INITIALIZATION

PRIORITY INFORMATION

This application is a Continuation of U.S. application Ser. No. 13/046,446, now U.S. Pat. No. 8,856,482, filed Mar. 11, 2011, and issued Oct. 7, 2014, the contents of which are incorporated herein by reference.

TECHNICAL FIELD

The present disclosure relates generally to semiconductor memory systems, devices, and methods, and more particularly, to systems, devices, memory controllers, and methods for memory initialization.

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a memory system such as a solid state drive (SSD), a portable memory drive (e.g., a flash drive), etc. A memory system can include non-volatile memory (e.g., NAND flash memory and NOR flash memory), and/or can include volatile memory (e.g., DRAM and SRAM), among various other types of non-volatile and volatile memory. For example, an SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electromechanical delays associated with magnetic disk drives. SSD manufacturers can use non-volatile flash memory to create flash SSDs that may not use an internal battery supply, thus allowing the drive to be more versatile and compact.

A memory system can include a number of discrete memory devices (e.g., packages), which can be multi-chip packages (MCPs). An MCP can include a number of memory dies and/or chips each having a number of memory units associated therewith. The memory units can execute commands received from a host, report status to the host, and can include a number of memory arrays along with peripheral circuitry. The memory arrays can include memory cells that can be organized into a number of physical groups (e.g., blocks), with each of the groups capable of storing multiple pages of data.

In various memory systems, multiple memory devices are coupled to a memory controller via a shared bus. The memory controller can regulate performance of various operations such as erase operations, program operations, and read operations, for example. The interaction between the memory controller and the multiple memory devices can affect various characteristics of a memory system including power consumption, processing speed, and/or data integrity, among other memory system characteristics.

BRIEF DESCRIPTION OF THE DRAWINGS

FIG. 5 is a flow chart illustrating a method for controlling memory in accordance with a number of embodiments of the present disclosure.

DETAILED DESCRIPTION

Figure 1:
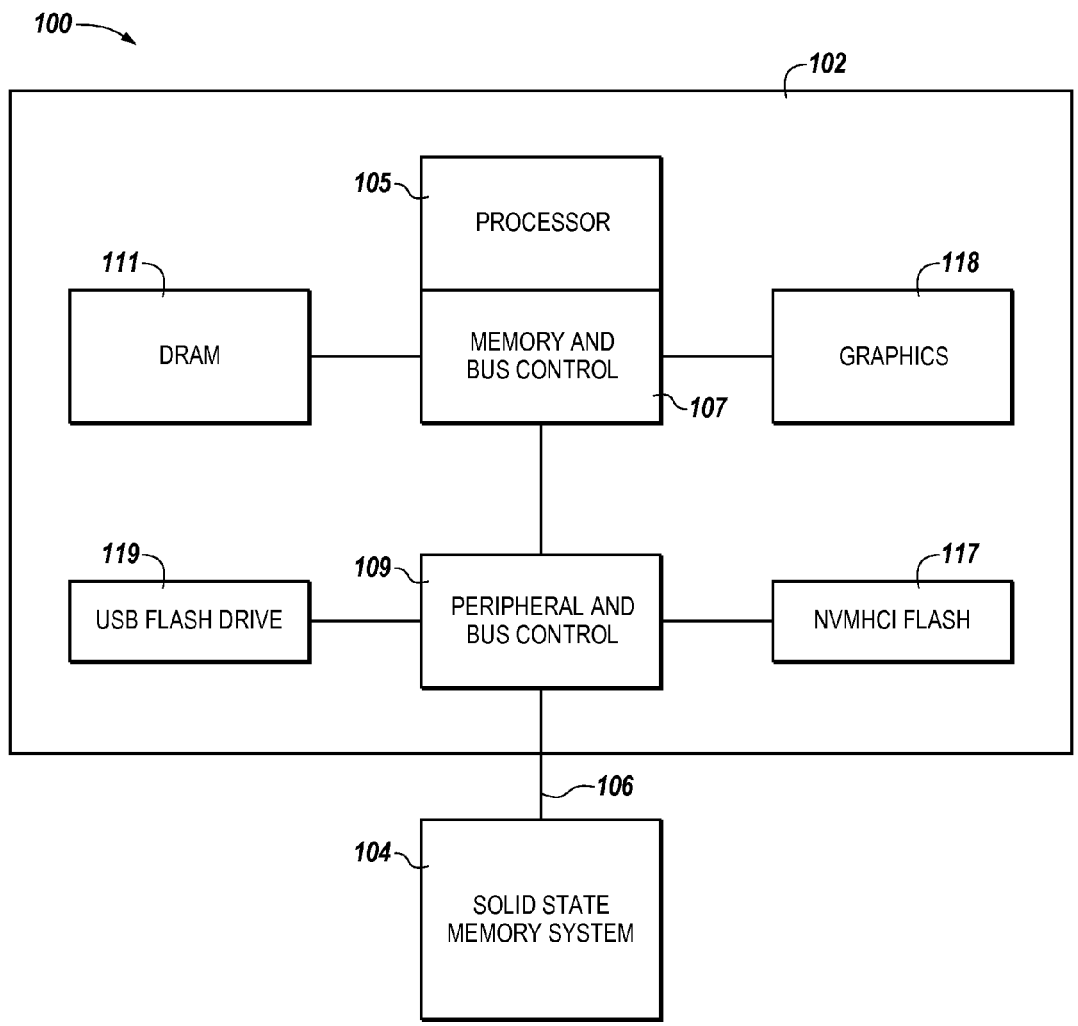
FIG. 1 is a block diagram of a computing system in accordance with a number of embodiments of the present disclosure.

The present disclosure includes systems, devices, memory controllers, and methods for initializing memory. Initializing memory can include configuring memory devices in parallel. The memory devices can receive a shared enable signal. A unique volume address can be assigned to each of the memory devices.

Embodiments of the present disclosure can provide various benefits such as reducing pin counts on memory controllers and/or providing flexibility regarding interaction between a memory controller and memory devices coupled to the memory controller via a shared bus as compared to some previous memory systems, devices, and methods, among other benefits. As an example, providing flexibility can include allowing a memory controller to control (e.g., initialize), memory devices in parallel or in series, which can allow the memory controller to tradeoff between power use and performance depending on which is more desirable in a particular instance.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "M," "P," and "Q," particularly with respect to reference numerals in the drawings, indicates that a number of the particular feature so designated can be included with a number of embodiments of the present disclosure. As used herein, "a number of" something can refer to a number of such things.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a functional block diagram of a computing system 100 in accordance with a number of embodiments of the present disclosure. Computing system 100 includes a memory system 104, for example a number of solid state drives (SSDs), communicatively coupled to a host 102. Memory system 104 can be communicatively coupled to the host 102 through an interface 106, such as a backplane or bus, for instance.

Examples of hosts 102 can include laptop computers, personal computers, digital cameras, digital recording and playback devices, mobile telephones, PDAs, memory card readers, and interface hubs, among other host systems. The interface 106 can include a serial advanced technology attachment (SATA), peripheral component interconnect express (PCIe), or a universal serial bus (USB), among other connectors and interfaces. In general, however, host interface 106 can provide an interface for passing control, address, data, and other signals between the memory system 104 and the host 102.

The host 102 can include a number of processors 105 (e.g., parallel processors, co-processors, etc.) communicatively coupled to a memory and bus control 107. The processor 105 can be a number of microprocessors, or some other type of controlling circuitry, such as a number of application-specific integrated circuits (ASICs), for example. Other components of the computing system 100 may also have processors. The memory and bus control 107 can have memory and other components directly communicatively coupled thereto, for example, dynamic random access memory (DRAM) 111, graphic user interface 118, and/or other user interface (e.g., display monitor, keyboard, mouse, etc.).

The memory and bus control 107 can also have a peripheral and bus control 109 communicatively coupled thereto, which in turn, can connect to a memory system, such as a flash drive 119 using a universal serial bus (USB) interface, for example, a non-volatile memory host control interface (NVMHCI), flash memory 117, and/or the memory system 104. As the reader will appreciate, the memory system 104 can be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1.

Figure 2:
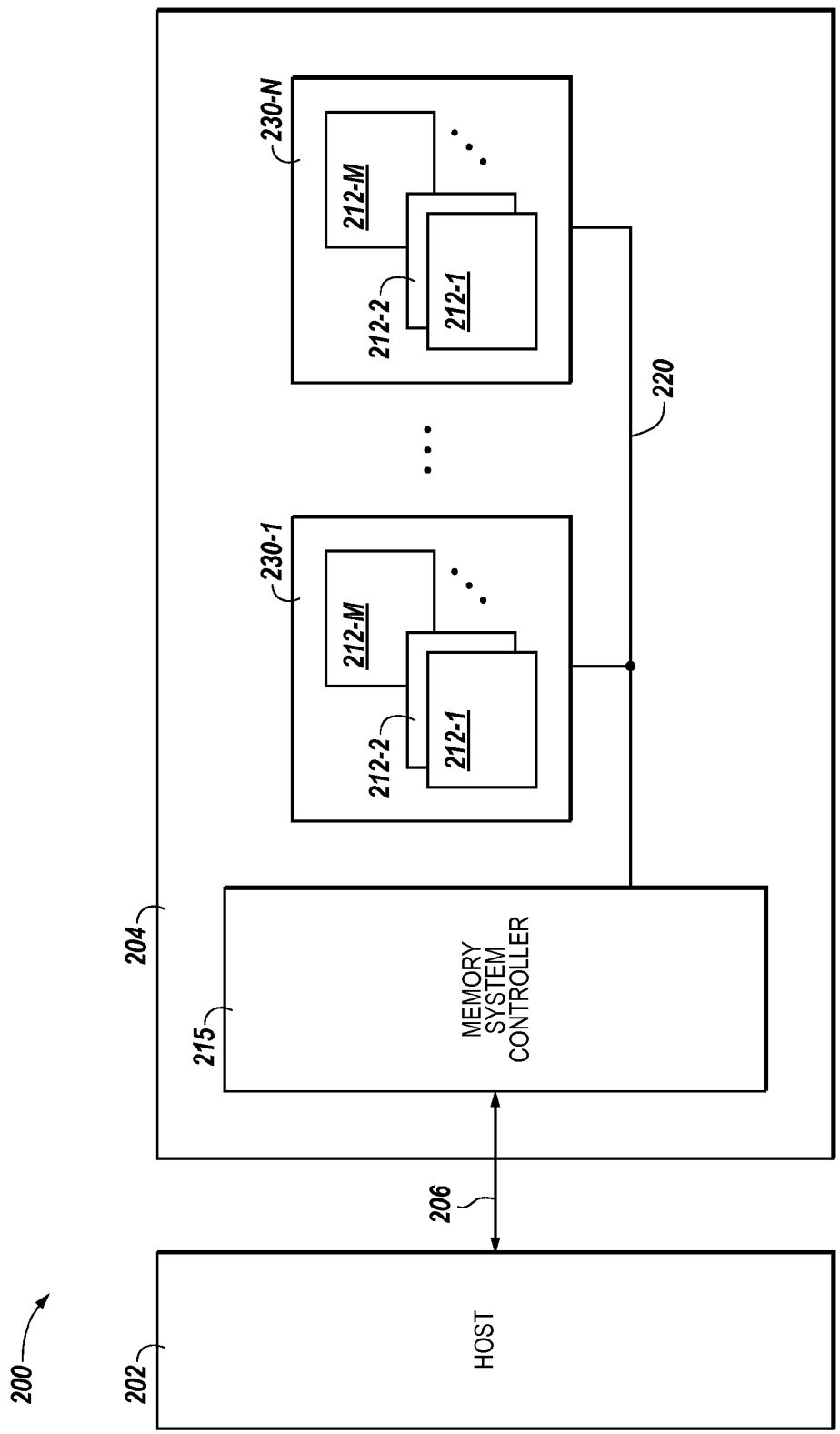
FIG. 2 is a block diagram of a portion of a system configured to control memory in accordance with a number of embodiments of the present disclosure.

FIG. 2 is a block diagram of a portion of a system 200 configured to control memory in accordance with a number of embodiments of the present disclosure. The system 200 includes a memory system 204, which can be an SSD, for example. The memory system 204 can be coupled to a host 202 via a host interface 206 and can include a memory controller 215 (e.g., memory control circuitry, firmware, and/or software), and a number of memory devices 230-1, . . . , 230-N coupled to the memory controller 215. In a number of embodiments, the memory controller 215 can be an application specific integrated circuit (ASIC) coupled to a printed circuit board.

The memory system 204 includes a bus 220 to send/receive various signals (e.g., data signals, control signals, and/or address signals), between the memory devices 230-1, . . . , 230-N and the memory controller 215. Although the example illustrated in FIG. 2 includes a single bus 220, the memory system 204 can include a separate data bus (DQ bus), control bus, and address bus, in some embodiments. The bus 220 is shared by the number of memory devices 230-1, . . . , 230-N and can have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

As illustrated in FIG. 2, the memory devices 230-1, . . . , 230-N can comprise a number of dies and/or chips that can include a number of memory units 212-1, 212-2, . . . , 212-M providing a storage volume for the memory system 204. The memory units 212-1, 212-2, . . . , 212-M can be referred to as logical units (LUNs) and can include a number of memory arrays along with peripheral circuitry thereon. In a number of embodiments, the memory units 212-1, 212-2, . . . , 212-M can be the minimum component of memory system 204 capable of independently executing commands from and reporting status to the memory controller 215 and/or host 202 via bus 220. The memory units 212-1, 212-2, . . . , 212-M can include Flash memory arrays having a NAND architecture, for example. However, embodiments are not limited to a particular type of memory array or array architecture.

As described further below in connection with FIGS. 3-4, the memory units 212-1, 212-2, . . . , 212-M within the memory devices 230-1, . . . , 230-N can be organized into a number of volumes. In a number of embodiments, each volume can be a set of memory units that share an enable signal (e.g., a chip enable (CE) signal) received from the memory controller 215, within one of the memory devices 230-1, . . . , 230-N. For instance, a number of enable inputs and/or outputs (e.g., pins, terminals, etc.) associated with the memory devices 230-1, . . . , 230-N can be coupled together and may be coupled to one shared enable output (e.g., pin, terminal, etc.) of the memory controller 215. As such, a single chip enable output of the controller may be shared by a number of the memory devices 230-1, . . . , 230-N, in various embodiments.

The state of an enable signal (e.g., a chip enable signal) can be used to activate and/or deactivate a memory volume, and in some instances, an entire memory device. For example, a memory system can be configured such that memory volumes are active low (e.g., the memory volumes can process commands received from the memory controller when their associated chip enable signal is in a low state). For active low memory volumes, the memory volumes become inactive (e.g., deselected) and cannot process commands when the chip enable signal they share is in a high state. Embodiments of the present disclosure are not limited to memory volumes having a particular chip enable configuration.

The target volume(s) within the memory devices 230-1, . . . , 230-N can have volume addresses assigned thereto. As used herein, assigning can refer to, for example, assigning, establishing, and/or setting a volume address. The assigned volume addresses can be used to distinguish among target volumes associated with a shared chip enable signal, as described further below.

Figure 3:
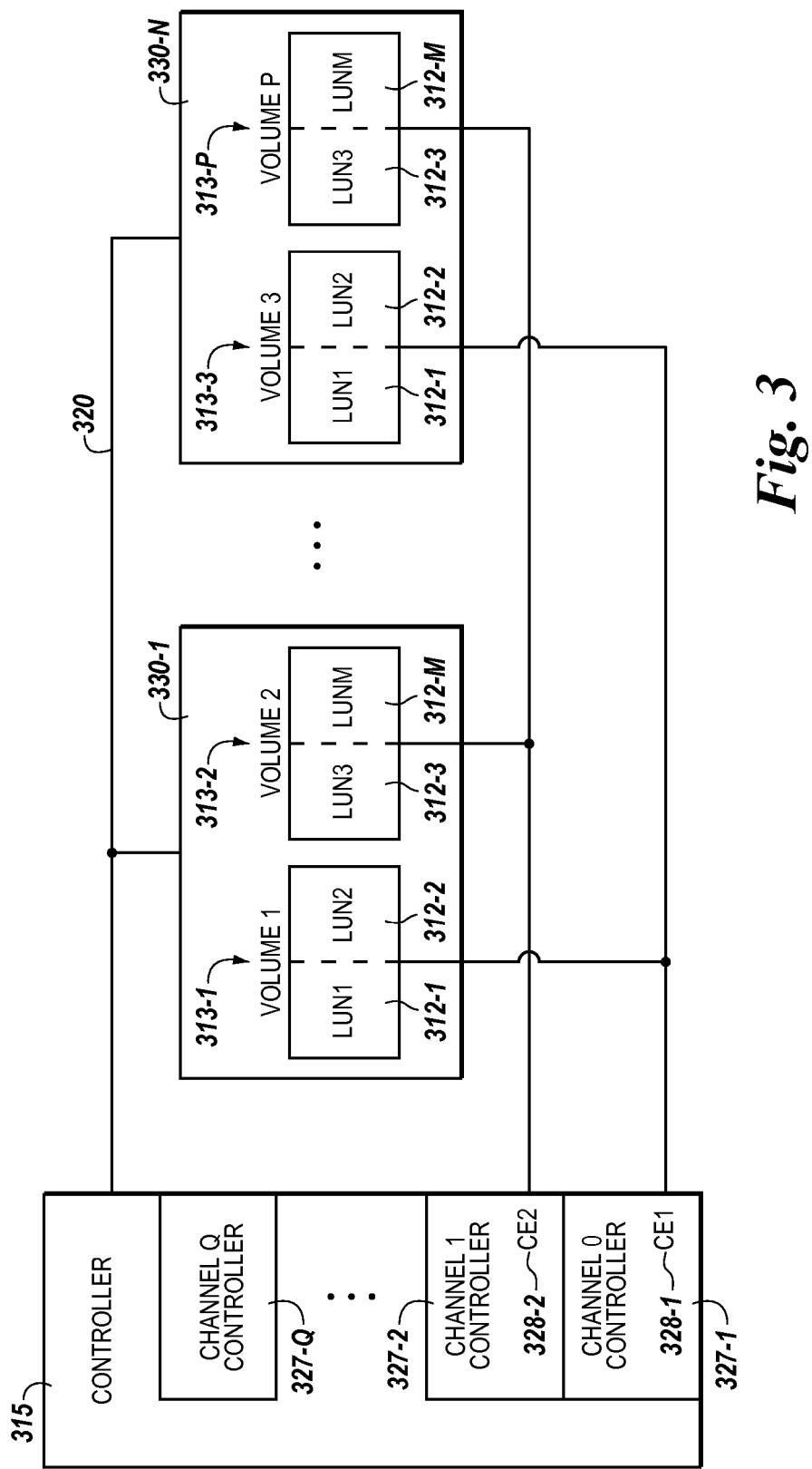
FIG. 3 is a block diagram of a portion of a system configured to control memory in accordance with a number of embodiments of the present disclosure.

FIG. 3 is a block diagram of a portion of a system configured to control memory in accordance with a number of embodiments of the present disclosure. The memory system illustrated in FIG. 3 includes a memory controller 315. The memory controller 315 can control access across a number of memory channels. In this example, the controller 315 includes a number of channel controllers 327-1, 327-2, ..., 327-Q each controlling access to a respective memory channel. Although FIG. 3 illustrates separate channel controllers 328-1, 328-2, ..., 328-N for each channel, in some embodiments, a channel controller can control more than one channel and/or all channels can be controlled by a single memory controller.

The memory controller 315 can include a first interface for coupling the memory controller 315 to a host (e.g., host 202 illustrated in FIG. 2). The memory controller 315 can include a second interface for coupling the memory controller 315 to a plurality of memory devices 330-1, ..., 330-N arranged in a linear daisy chain configuration. According to a number of embodiments of the present disclosure, the memory controller 315 can be configured to provide a shared enable signal (e.g., a chip enable signal) to the plurality of memory devices 330-1, ..., 330-N during an initialization of the plurality of memory devices 330-1, ..., 330-N and to assign a unique volume address to each volume 313-1, ..., 313-P of the plurality of memory devices 330-1, ..., 330-N during the initialization. The memory controller 315 can be configured to configure the plurality of memory devices 330-1, ..., 330-N during the initialization of the plurality of memory devices 330-1, ..., 330-N. In some embodiments, the memory controller 315 can be configured to configure the plurality of memory devices 330-1, ..., 330-N and to assign a number of unique volume addresses at each initialization of the plurality of memory devices 330-1, ..., 330-N. The memory controller 315 can be configured to configure a particular one of the plurality of memory devices 330-1, ..., 330-N prior to assigning the unique volume address to the particular one of the plurality of memory devices 330-1, ..., 330-N.

In the example shown in FIG. 3, the memory controller 315 is coupled to a number of memory devices 330-1, ..., 330-N via a bus 320 (e.g., a shared data, address, and control bus). Each of the memory devices 330-1 and 330-2 includes a number of memory units 312-1, 312-2, 312-3, ..., 312-M. The memory units 312-1, ..., 312-M can be memory die and the memory devices 330-1, ..., 330-N can be multi-chip packages, as an example. In this example, the memory units 312-1, ..., 312-M within each memory device are organized (e.g., grouped) into a number of target volumes 313-1, 313-2, 313-3, ..., 313-P. A group of memory units of a target volume can share a chip enable (CE). For example, a chip enable can take the form of a pin or another physical contact. For instance, memory units 312-1 and 312-2 can be included in target volume 313-1 within memory device 330-1.

In this example, the memory controller includes two CE pins 328-1 (CE1) and 328-2 (CE2) dedicated to providing CE signals to the memory devices 330-1 and 330-2. For instance, CE1 s coupled to a CE pin associated with target volume 313-1 within memory device 330-1 and with target volume 313-3 within memory device 330-N, while CE2 is coupled to a CE pin associated with target volume 313-2 within memory device 330-1 and with target volume 313-P within memory device 330-N.

The controller 315 and memory devices 330-1, ..., 330-N can have various other contacts (e.g., pins) connected via signal lines, for instance, which can be part of bus 320. Although not shown in FIG. 3, each of the channel controllers 327-1, ..., 327-Q can be coupled to a number of memory devices. Embodiments are not limited to the example shown in FIG. 3. For instance, the memory system can include more or fewer memory devices per channel, more or fewer target volumes per memory device, etc.

In the example illustrated in FIG. 3, each of the target volumes 313-1, ..., 313-P has an assigned volume address associated therewith (e.g., "Volume 1," Volume 2," Volume 3," ..., "Volume P"). As described further below in connection with FIG. 5, a command provided by the controller 315 can assign a volume address to a particular memory device (e.g., to a particular one of the target volumes) to receive a number of later commands from the controller 315.

Figure 4:
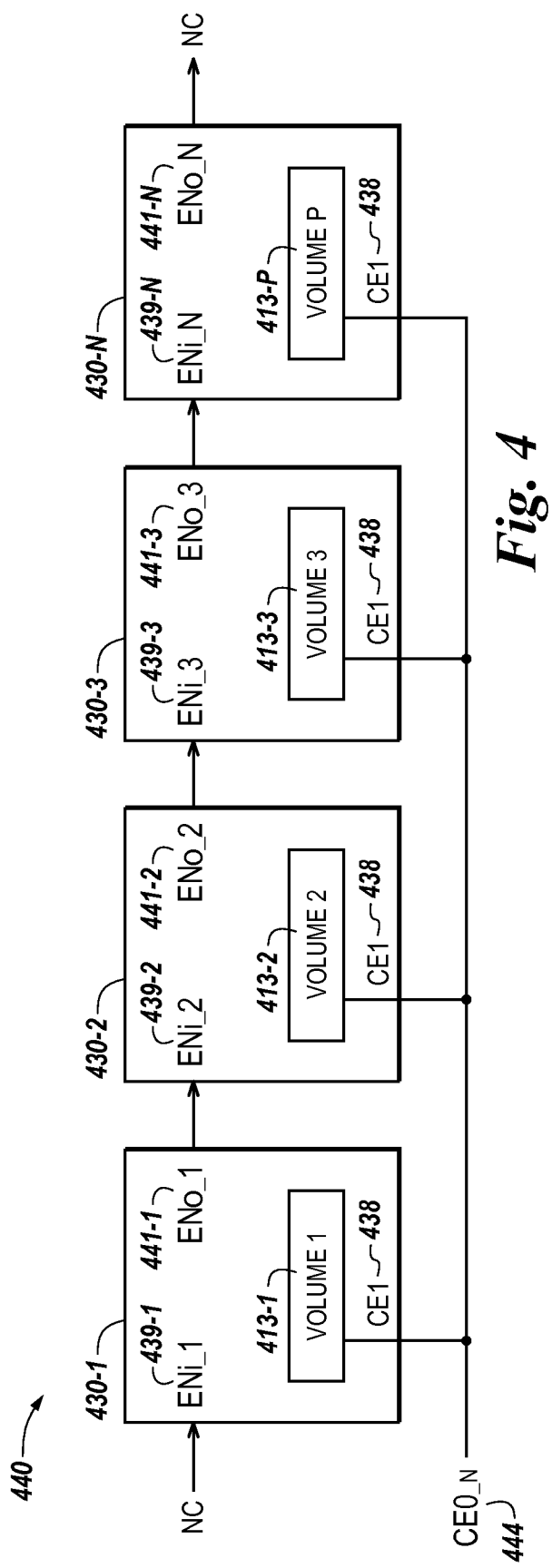
FIG. 4 is a block diagram of a portion of a system configured to control memory in accordance with a number of embodiments of the present disclosure.

FIG. 4 is a block diagram of a portion of a system configured to control memory in accordance with a number of embodiments of the present disclosure. The embodiment illustrated in FIG. 4 includes a number of memory devices 430-1, 430-2, 430-3, ..., 430-N and illustrates an example topology for initializing memory in accordance with a number of embodiments of the present disclosure. For example, the topology can be a linear daisy chain configuration 440 as illustrated. The memory devices 430-1, ..., 430-N can be memory devices such as devices 330-1, ..., 330-N shown in FIG. 3. As an example, the memory devices 430-1, ..., 430-N can be NAND memory devices.

In the example illustrated in FIG. 4, each of the devices 430-1, ..., 430-N includes a chain input 439 and a chain output 441. For instance, device 430-1 includes chain input 439-1 (ENi_1) and chain output 441-1 (ENo_1), device 430-2 includes chain input 439-2 (ENi_2) and chain output 441-2 (ENo_2), device 430-3 includes chain input 439-3 (ENi_3) and chain output 441-3 (ENo_3), and device 430-N includes chain input 439-N (ENi_N) and chain output 441-N (ENo_N). As illustrated, the chain inputs 439 and chain outputs 441 of the memory devices 430-1, ..., 430-N can be coupled to create a linear daisy chain configuration 440. In this example, the chain input 439-1 of the first device 430-1 in the chain and the chain output 441-N of the last device 430-N in the chain are not connected (NC). The chain inputs 439 of the other devices are connected to the chain output 441 of the previous device in a linear daisy chain configuration 440 as shown in FIG. 4.

As illustrated in FIG. 4, and as described above in connection with FIG. 3, each of the memory devices 430-1, ..., 430-N include an input to receive a shared enable signal from a memory controller (e.g., memory controller 315 illustrated in FIG. 3). Thus, each of the memory devices 430-1, ..., 430-N share a common CE pin from the memory controller. For instance, a chip enable signal 444 (CE0_N) from a memory controller is shared by the chip enable pin 438 (CE1) of each of the memory devices 430-1, ..., 430-N. The CE1 pin of each of the memory devices 430-1, ..., 430-N is associated with (e.g., corresponds to) a particular target volume 413-1, 413-2, 413-3, ..., 413-P. As described above, a target volume can refer to a number of memory units (e.g., LUNs) that share a particular CE signal within a memory device. Each of the target volumes can have a volume address (e.g., a unique non-fixed volume address) assigned thereto. In this example, target volume 413-1 is assigned volume address "Volume 1," target volume 413-2 is assigned volume address "Volume 2," target volume 413-3 is assigned volume address "Volume 3," and target volume 413-P is assigned volume address "Volume P." In a number of embodiments, the volume addresses can be assigned to particular target volumes during initialization (e.g., at power up).

In operation, the states of the chain inputs 439-1, 439-2, 439-3, . . . , 439-N and of the chip enable pin 438 (e.g., based on the state of chip enable signal 444) determines whether the respective memory device 430-1, . . . , 430-N are able to accept commands. For example, if the chain input 439 of a particular device is high and the CE pin 438 of the device is low, then the particular device can accept commands. If the chain input 439 of the particular device is low or the CE pin 438 is high, then the device cannot accept commands. Embodiments are not limited to this example as the combination of states of the chain input 439 and CE pin 438 can be configured differently to allow the device to accept commands.

In a number of embodiments, a memory controller can provide (e.g., issue) a command indicating a target volume address of a particular target volume to process a number of subsequent commands. For instance, a volume select command can be provided by the memory controller to the number of memory devices 430-1, . . . , 430-N (e.g., via a shared bus) in order to select a particular target volume (e.g., 413-1 . . . , 413-P) sharing a particular chip enable signal 444 from the memory controller. In this manner, volume addressing can be used to access particular target volumes of the memory devices 430-1, . . . , 430-N.

In a number of embodiments, a chip enable signal (e.g., chip enable signal 444) received from a memory controller (e.g., via a shared bus such as shared bus 320 shown in FIG. 3) is used to activate a number of memory devices (e.g., 430-1, . . . , 430-N). For example, assuming the memory devices 430-1, . . . , 430-N are active low, they can be activated responsive to detecting the chip enable signal 444 switching from a first state to a second state (e.g., from a high to a low state).

A command can subsequently be provided to the activated number of memory devices 430-1, . . . , 430-N. In a number of embodiments, the command can indicate (e.g., via a target volume address) a target volume of the number of target volumes (e.g., 413-1 . . . , 413-P) within a particular one of the number of memory devices 430-1, . . . , 430-N. The target volume indicated by the command remains active (e.g., selected) and the remaining target volumes return to their previous states (e.g., their states prior to activation responsive to detecting the switching of the chip enable signal).

If the command received subsequent to activation responsive to switching of the chip enable signal does not indicate a target volume (e.g., the command is not a volume select command) then each of the memory devices 430-1, . . . , 430-N and target volumes 413-1 . . . , 413-P therein return to their previous states. As such, a previously selected one of the number of memory volumes (e.g., the memory volume which was selected prior to detecting the switching of the enable signal) will remain selected. Also, those memory volumes which were previously unselected will return to an unselected state.

FIG. 5 is a flow chart illustrating a method 550 for controlling memory in accordance with a number of embodiments of the present disclosure. The method 550 can be applied to various memory systems such as those described above in FIGS. 1-4. As an example, the method 550 can apply to a number of memory devices coupled to a memory controller via a shared bus. In this example, the number of memory volumes share a chip enable signal (CE#) from the memory controller and are active low (e.g., the memory volumes activate responsive to detection of a low signal state of the chip enable signal). The memory volumes can each include a number of memory units (e.g., LUNs) capable of independently executing commands and reporting status to the memory controller. In a number of embodiments, volume addresses can be assigned to target volumes. A target volume can include a number of memory units sharing a chip enable signal within a memory device (e.g., a package). In a number of embodiments, the volume addresses can be assigned to the target volumes during initialization of the system (e.g., at power up). The assigned volume addresses can be maintained across reset commands, in a number of embodiments, and different volume addresses can be assigned to the target volumes during a subsequent initialization.

As illustrated at block 552, an initialization can begin at power on, however embodiments are not so limited as initialization can occur without powering on a memory system from a power off state (e.g., a system could be reinitialized without first powering off the memory system). At block 554, a shared enable signal (e.g., a shared CE#) is set to a first state (e.g., a low state). The shared CE# can be set to the first state subsequent to a power up or other memory initialization (including reinitialization) causing event. As described herein, the shared CE# can be coupled to a plurality of memory devices, where the plurality of memory devices are arranged in a linear daisy chain configuration. The memory volumes associated with the shared CE# can be configured in parallel or in sequence as indicated at block 556. For example, a memory controller can selectively configure the memory volumes during the initialization in sequence or in parallel, such as by including a programmable option. A programmable option can be set either during operation of the memory controller (e.g., during an initialization) or can be set prior to operation of the memory controller (e.g., at fabrication or initial configuration of the memory controller) among others.

In the case of a sequential memory volume configuration, a preliminary command (e.g., a read status command (70h)), can be provided (e.g., issued) to each of the plurality of memory devices as indicated at block 558. A read status command can cause retrieval of a status value for the last operation provided. Such a command can be accepted by all memory devices regardless of a state of the chain input of the memory devices. Some memory systems may require that a memory controller provide such a preliminary command before any other command can be provided. Following the preliminary command, a reset command can be provided as indicated at block 560-1. The reset command (FFh) can be provided to a first memory device of the plurality of memory devices (e.g., a memory device having a chain input set to a particular state such as a high state). That is, in some embodiments, the reset command may only be accepted by a memory device having a chain input set to the particular state. Thus, providing the reset command can include resetting a particular memory volume in response to the particular memory device having a chain input in the particular state. A reset command can put the target memory device in a power up state (e.g., a default power up state).

At least partially in response to the reset command, the first memory volume can be configured as indicated at block 562. For instance, configuring the first memory device can include loading trims on the first memory device. Configuring the memory device can include reading and/or writing a device identifier, reading and/or writing device parameters, reading and/or writing device boot code, and/or other configuration actions such that the host can receive and/or provide configuration information from and/or to the memory volume.

Subsequent to configuration of the first memory volume, a volume address can be assigned to the first memory volume as indicated at block 564-1. For example a set feature command can be provided to assign a volume address to the first memory volume. A volume address can be assigned to each volume in a memory device. For example, a particular memory device including two target volumes can have two unique non-fixed volume addresses assigned thereto. After a time associated with the assignment of the volume address has lapsed, a chain output of the first memory device can be set to a particular state (e.g., a high state) to deselect the first memory device and/or a target volume associated therewith and cause the chain input of the first memory device to be ignored. A state of the chain input of the first memory device can be changed (e.g., to a low state).

Subsequent to the volume address being assigned to the first memory volume, a determination can be made as to whether there is another memory device in the chain as indicated at block 566-1. For example, a presence of a next memory device in the chain can be indicated in response to a subsequent query (e.g., a read identification (ID) command) being provided (e.g., to a second memory device) after the first memory device has been deselected. A read ID command can identify that a target to which the command was provided supports a particular standard (e.g., the ONFI standard). In response to a read ID command, a device supporting the particular standard can return a particular signature indicating the same. In some embodiments, if a device does not support the particular standard, the device will not respond to the read ID command. If a next device responds, then the sequential configuration process can continue as described above for the first memory volume (e.g., as described with respect to blocks 560-1 through 566-1). A second memory device can be configured and have a second volume address assigned thereto.

As described herein, volume addresses can be unique (e.g., each assigned volume address can be different) and non-fixed (e.g., a particular memory volume can have a different volume address assigned during a subsequent initialization). For example, the plurality of memory volumes can be reconfigured and a unique non-fixed volume address can be reassigned to each of the plurality of memory volumes during a subsequent initialization. As used herein, "reassigning" a volume address does not imply that the same volume address is assigned to the same memory volume. Rather, "reassigning" a volume address indicates that a subsequent volume address is assigned to a particular memory volume. In some instances, a particular memory device can be retired, in which case the retired memory device would not have a unique non-fixed volume address assigned thereto during a subsequent initialization, nor would the retired memory device be configured during the subsequent initialization. In some instances, a new memory device can be added to the chain after a previous initialization without the new memory device. In such instances, during a subsequent initialization, the plurality of memory devices can be reconfigured and the new memory device can be configured and have unique non-fixed volume addresses assigned thereto. Such embodiments allow for flexibility in operation of a chain of memory devices by providing for devices to be retired and/or added. In a number of embodiments, the initialization process can be repeated until all of the memory devices have been initialized. For example, subsequent reset commands can be provided sequentially to the remaining memory devices in the chain, the remaining memory devices can be configured sequentially, and different volume addresses can be assigned to the remaining memory devices sequentially.

If a next memory device does not respond, then a determination can be made as to whether a next chip enable should be initialized as indicated at block 568-1 (e.g., for those memory controllers including more than one CE# such as memory controller 315 illustrated in FIG. 3). If another CE# is to be initialized, the process can return to block 554 where the next CE# can be set to the first state for initialization of memory devices and/or volumes associated with the next CE#. After the memory devices and/or volumes associated with a particular CE# have been initialized, the state of the particular CE# can be set to a different state (second state) (e.g., a high state), as illustrated at block 570. Subsequently a volume select command can be provided to select a volume for additional commands (e.g., setting up an on die termination (ODT) matrix), among other commands and/or operations.

Returning to the determination as to whether parallel or sequential configuration will be performed as indicated at block 556, in the case of parallel memory device configuration, a reset command (FFh), can be provided to each of the plurality of memory devices as indicated at block 560-2. According to a parallel configuration process, the plurality of memory devices can accept the reset command regardless of a state of a chain input (e.g., high or low) of each of the plurality of memory devices. Each of the plurality of memory devices in the chain can be configured in parallel (e.g., substantially simultaneously) in response to the reset command as indicated at block 574. As used with respect to parallel configuration, "substantially simultaneously" at least includes the plurality of memory devices being configured together without the memory controller providing separate commands to configure the plurality of memory devices independently. In some embodiments, "substantially simultaneously" can include configuring the plurality of memory devices at the same time. Configuring the memory devices is described in more detail above with respect to block 562. Parallel configuration can be analogous to sequential configuration except that the memory devices are configured substantially simultaneously in parallel rather than individually in sequence.

After the plurality of memory devices have been configured, a volume address (e.g., a unique non-fixed volume address) can be assigned to each of the memory volumes as indicated at block 564-2. Assignment of a volume address according to the parallel configuration process can be analogous to the assignment of a volume address according to the sequential configuration process as described above with respect to block 564-1. Unlike parallel configuration, where the plurality of memory devices are configured substantially simultaneously, the volume addresses can be assigned sequentially to each of the plurality of memory devices. In response to (e.g., after) a volume address being assigned to a first memory device, a chain output of the first memory device can be driven to a particular state (e.g., a high state) to deselect the first memory device and ignore a state of the chain input of the first memory device.

A first volume address can be assigned to a first memory volume and then a determination can be made as to whether a next device exists in the chain for assignment of a next volume address as indicated at block 566-2. For example, a presence of a next memory device in the chain can be indicated in response to a subsequent query (e.g., a read ID command) being provided (e.g., to a second memory device) after the first memory device has been deselected. A read ID command can identify that a target to which the command was provided supports a particular standard (e.g., the ONFI standard). In response to a read ID command, a device supporting the particular standard can return a particular signature indicating the same. In some embodiments, if a device does not support the particular standard, the device will not respond to the read ID command. If a next device responds, a volume address can be assigned to the next device as indicated at block 564-2.

If a next device does not respond, then a CE# can be set to a different state and thereby deselect each of the plurality of memory devices and/or volumes associated with that CE#. In response to a next memory device not responding (e.g., in response to there being no more memory devices associated with a particular CE# to be initialized in the chain) a determination can be made as to whether a next chip enable should be initialized as indicated at block 568-2 (e.g., for those memory controllers including more than one CE#, such as memory controller 315 illustrated in FIG. 3). The process for determining whether a next CE# should be initialized can be analogous to that described above with respect to block 568-1. After the memory devices and/or volumes associated with a particular CE# have been initialized, the state of the particular CE# can be set to a different state (second state) (e.g., a high state) as illustrated at block 570. Subsequently a volume select command (E1h) can be provided to select a volume for additional commands (e.g., setting up an on die termination (ODT) matrix) among other commands and/or operations.

Conclusion

The present disclosure includes systems, devices, memory controllers, and methods for initializing memory. Initializing memory can include configuring memory devices in parallel. The memory devices can receive a shared enable signal. A unique volume address can be assigned to each of the memory devices.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for initializing memory, comprising:
   determining whether to configure a plurality of memory devices in parallel or in sequence;
   configuring, by a controller, the plurality of memory devices in parallel or in sequence, wherein the plurality of memory devices receive a shared enable signal; and
   assigning a unique volume address to each of the plurality of memory devices.

2. The method of claim 1, wherein assigning the unique volume address includes assigning two unique volume addresses to a particular one of the plurality of memory devices during the initialization, wherein the particular one of the plurality of memory devices includes two target volumes.

3. The method of claim 1, wherein the method includes reconfiguring the plurality of memory devices, and reassigning a unique volume address to each of the plurality of memory devices during a subsequent initialization.

4. The method of claim 1, wherein assigning the unique volume address includes assigning a unique non-fixed volume address.

5. The method of claim 1, wherein assigning the unique volume address includes assigning a unique volume address to each of the plurality of memory devices in sequence.

6. The method of claim 1, wherein assigning the unique volume address includes assigning one unique volume addresses to a particular one of the plurality of memory devices during the initialization, wherein the particular one of the plurality of memory devices includes one target volume.

7. The method of claim 1, wherein the method includes retiring a particular one of the plurality of memory devices such that the particular memory device does not have a unique volume address assigned thereto during a subsequent initialization.

8. The method of claim 1, wherein configuring the plurality of memory devices in parallel includes configuring the plurality of memory devices during an initialization, wherein the plurality of memory devices are in a linear daisy chain configuration.

9. The method of claim 8, wherein the method includes:
   configuring the plurality of memory devices, and an additional memory device added to the linear daisy chain configuration, during a subsequent initialization; and
   assigning a unique non-fixed volume address to each of the plurality of memory devices and to the additional memory device during the subsequent initialization.

10. A memory controller, comprising:
    a first interface for coupling the memory controller to a host; and
    a second interface for coupling the memory controller to a plurality of memory devices arranged in a linear daisy chain configuration, wherein the memory controller is configured to:
    set a shared enable signal to a particular state, wherein the shared enable signal is coupled to a plurality of memory devices, and wherein the plurality of memory devices are arranged in a linear daisy chain configuration;
    provide a reset command to each of the plurality of memory devices;
    determine whether to configure the plurality of memory devices in parallel or in sequence;
    configure the plurality of memory devices in parallel or in sequence after the resent command is provided; and assign a unique volume address to each of the plurality of memory devices.

11. The memory controller of claim 10, wherein the memory controller is configured to assign a unique non-fixed volume address to each of the plurality of memory devices in sequence.

12. The memory controller of claim 10, wherein the memory controller is configured to:
assign a first volume address to a first of the plurality of memory devices in response to the first of the plurality of memory devices indicating support in response to a first query; and
assigning a second volume address to a second of the plurality of memory devices in response to the second of the plurality of memory devices indicating support in response to a second query.

13. The memory controller of claim 10, wherein the memory controller is configured to assign the unique volume address to a particular one of the plurality of memory devices in response to the particular one of the plurality of memory devices indicating support in response to a respective query; and
wherein the memory controller is configured to set the shared enable signal to a different state in response to the respective query being unanswered.

14. The memory controller of claim 13, wherein the memory controller is configured to deselect each of the plurality of memory devices to set the shared enable signal to the different state.

15. The memory controller of claim 10, wherein the memory controller is configured to assign the unique volume address to one target volume within each of the plurality of memory devices.

16. The memory controller of claim 10, wherein the memory controller is configured to assign a unique volume address to each target volume within each of the plurality of memory devices.

17. A memory system, comprising:
a plurality of memory devices coupled in a linear daisy chain configuration; and
a memory controller coupled to the plurality of memory devices, wherein the memory controller is configured to:
provide a shared enable signal to the plurality of memory devices;
determine whether to configure the plurality of memory devices in parallel or in sequence;
configure the plurality of memory devices in parallel or in sequence during an initialization of the plurality of memory devices; and
assign a unique volume address to each of the plurality of memory devices during the initialization.

18. The memory system of claim 17 wherein each of the plurality of memory devices includes:
an input to receive the shared enable signal;
an additional chain input; and
a chain output;
wherein the additional chain output of a second memory device of the plurality of memory devices is coupled to the additional chain input of a next one of the plurality of memory devices in the linear daisy chain configuration.

19. The memory system of claim 18, wherein:
the additional chain output of a third memory device of the plurality of memory devices is driven to a first state responsive to the unique volume address being assigned to the third particular one of the plurality of memory devices; and
the additional chain output of the third memory device being in the first state causes the third memory device to be deselected.

20. The memory system of claim 18, wherein:
if the controller is selectively configured to configure the devices in sequence, a third memory device of the plurality of memory devices having a third chain input in a first state is configured to:
have a unique volume address assigned thereto; and
have a second chain output driven to the first state in response to the unique volume address being assigned thereto.

* * * * *